US008723277B2

(12) United States Patent
Dehe et al.

(10) Patent No.: US 8,723,277 B2
(45) Date of Patent: May 13, 2014

(54) TUNABLE MEMS DEVICE AND METHOD OF MAKING A TUNABLE MEMS DEVICE

(75) Inventors: Alfons Dehe, Reutlingen (DE); Martin Wurzer, Munich (DE); Christian Herzum, Stamberg (DE); Wolfgang Klein, Zorneding (DE); Stefan Barzen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 133 days.

(21) Appl. No.: 13/408,928

(22) Filed: Feb. 29, 2012

(65) Prior Publication Data
US 2013/0221453 A1    Aug. 29, 2013

(51) Int. Cl.
*H01L 29/84* (2006.01)

(52) U.S. Cl.
USPC .............. 257/415; 257/E29.234; 438/50

(58) Field of Classification Search
USPC .............. 257/415, E29.324, E21.211; 438/50
See application file for complete search history.

(56) References Cited

U.S. PATENT DOCUMENTS

| 7,581,824 | B2 * | 9/2009 | Fujii et al. | 347/71 |
| 7,912,236 | B2 * | 3/2011 | Dehe et al. | 381/175 |
| 2012/0205754 | A1 * | 8/2012 | Iwamoto | 257/415 |

* cited by examiner

*Primary Examiner* — Roy Potter
(74) *Attorney, Agent, or Firm* — Slater & Matsil, L.L.P.

(57) ABSTRACT

A tunable MEMS device and a method of manufacturing a tunable MEMS device are disclosed. In accordance with an embodiment of the present invention, a semiconductor device comprises a substrate, a moveable electrode and a counter electrode. The moveable electrode or the counter electrode comprises a first region and a second region, wherein the first region is isolated from the second region, wherein the first region is configured to be tuned, wherein the second region is configured to provide a sensing signal or control a system, and wherein the moveable electrode and the counter electrode are mechanically connected to the substrate.

30 Claims, 11 Drawing Sheets

TUNABLE MEMS DEVICE AND METHOD OF MAKING A TUNABLE MEMS DEVICE

TECHNICAL FIELD

The present invention relates generally to tunable MEMS devices and a method of making tunable MEMS devices.

BACKGROUND

A MEMS (MicroElectrical-Mechanical System) microphone comprises a pressure-sensitive diaphragm disposed in a silicon chip. The MEMS microphone is sometimes integrated with a preamplifier into a single chip. MEMS microphones may also include an analog-to-digital converter (ADC) circuit making it a digital MEMS microphone.

SUMMARY OF THE INVENTION

In accordance with an embodiment of the present invention, a semiconductor device comprises a substrate, a moveable electrode and a counter electrode. The moveable electrode or the counter electrode comprises a first region and a second region, wherein the first region is isolated from the second region, wherein the first region is configured to be tuned, wherein the second region is configured to provide a sensing signal or to control a system, and wherein the moveable electrode and the counter electrode are mechanically connected to the substrate.

In accordance with an embodiment of the present invention, a MEMS structure comprises a substrate, a moveable electrode and a counter electrode. The counter electrode comprises a first counter electrode region and a second counter electrode region, wherein the first counter electrode region is isolated from the second counter electrode region, and wherein the counter electrode and the moveable electrode are mechanically connected to the substrate.

In accordance with an embodiment of the present invention, a MEMS structure comprises a semiconductor substrate, a backplate electrode, and a stacked membrane, wherein the stacked membrane and the backplate are mechanically connected to the semiconductor substrate. The stacked membrane comprises a first membrane and a second membrane.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely sensors or microphones. The invention may also be applied, however, to other MEMS structures such as RF MEMS, accelerometers and actuators.

Figure 1A:
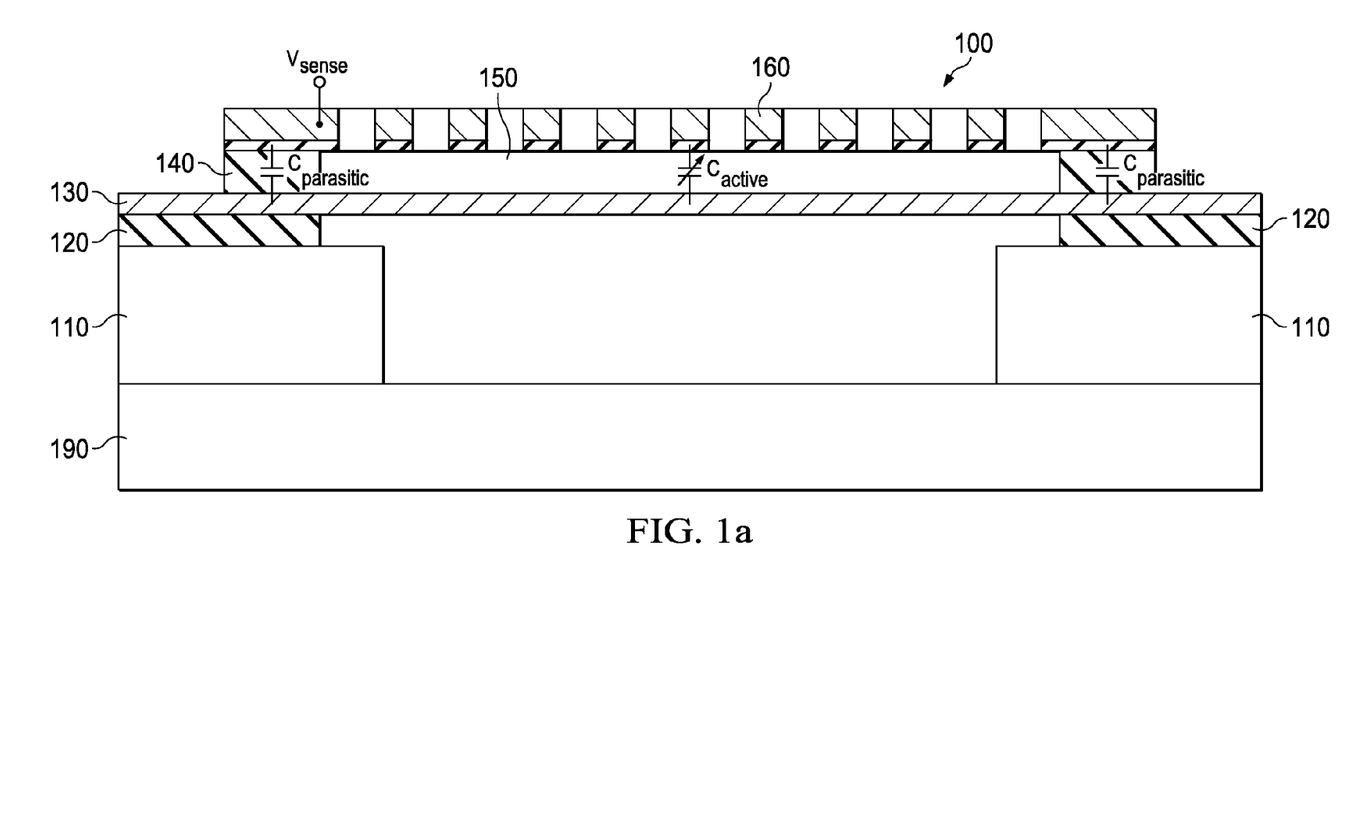
FIG. 1a shows a cross-sectional view of a MEMS structure.
Figure 1B:
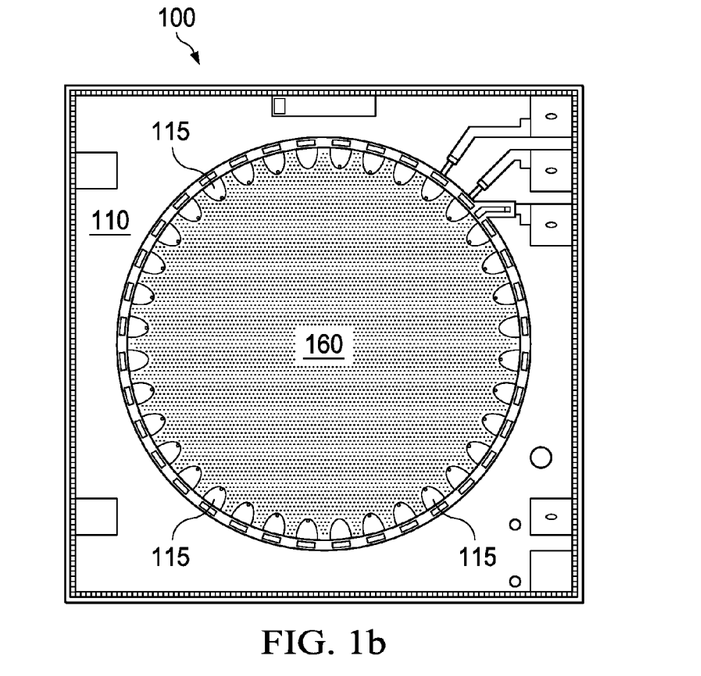
FIG. 1b shows a top view of a MEMS structure.

FIGS. 1a and 1b show a cross sectional view of a MEMS structure 100. The MEMS structure 100 comprises a diaphragm or membrane 130, a backplate 160 and an air gap 150 between the membrane 130 and the backplate 160. The membrane or membrane electrode 130 is configured to move or deflect relative to the backplate or fixed counter electrode 160. This deflection results in a change in capacity between the membrane 130 and the backplate 160 which can be measured.

The membrane 130 and the backplate 160 are connected to a substrate 110 along their circumference. The membrane 130 is connected to the substrate via a first spacer 120. Alternatively, the membrane 130 may be arranged in the main plane of the substrate 110 without the first spacer 120. A second spacer 140 is arranged between the membrane 130 and the backplate 150 along their circumference. The membrane 130 and the backplate 150 may comprise a circular form or a square form. Alternatively, the membrane 130 and the backplate 150 may comprise any geometrical suitable form. A back volume 180 is arranged between the MEMS structure 100 and a substrate 190 wherein the substrate 190 may comprise a printed circuit board (PCB).

The semiconductor substrate 110 comprises silicon, other semiconductor materials or compound semiconductors such as GaAs, InP, Si/Ge, or SiC. The semiconductor substrate 110 may comprise single crystal silicon, amorphous silicon or polycrystalline silicon (polysilicon). The semiconductor substrate 110 may be a silicon-on insulator (SOI). The semiconductor substrate 110 may include active components such as transistors, diodes, capacitors, amplifiers, filters or other electrical devices, or an integrated circuit (IC). The MEMS structure 100 may be a stand-alone device or may be integrated with an IC into a single chip.

The first spacer 120 and the second spacer 140 may comprise a dielectric or insulating material such a silicon dioxide, silicon nitride, a high-k dielectric such as siliconoxynitide or combinations thereof.

The membrane 130 and the backplate 160 may comprise a conductive material such as polysilicon, doped polysilicon or a metal. The backplate 160 may be perforated to reduce damping effects.

The membrane 130 has two regions which differ from each other. An outer region or edge region where the membrane 130 is connected to the semiconductor substrate 110. In this region the membrane 130 is mechanically fixed to the supporting rim structure of the semiconductor substrate 110 or the spacer 120 and cannot move. In an inner region, the membrane 130 is moveable or deflectable. The outer region of the membrane 130 does not contribute to a sensing signal generated by the inner region of the membrane 130 but adds parasitic capacitance to that signal. The inner region of the membrane 130 may generate a signal due to its deflection with respect to the counter electrode or backplate 160. Since the membrane is clamped at the edge (transition between inner and outer region of the membrane 130) the area of the membrane 130 close to the edge deflects with a smaller maximum amplitude 130 while the area toward the center of the inner region of the membrane 130 deflects with a larger maximum amplitude. Hence the center of the inner region of the membrane 130 contributes most to the sensitivity. It would be advantageous to use only about the 80% inner region of the membrane to generate a sensing signal.

The distance between the membrane 130 and the backplate 160 and therefore the mechanical sensitivity is given by mechanical constraints and cannot be changed after the fabrication process of the MEMS structure is finalized. The membrane 130 and the backplate 160 form a static capacitance along the support structure (overlap of the membrane 130 and backplate 160 along the spacers 120, 140). To decrease the static capacitance, the membrane 130 and the backplate 160 may only partially overlap. For example, the backplate 160 may have recesses extending through the backplate 160 in equidistant distances as illustrated in FIG. 1b. To further minimize the influence of the static capacitance, a guard structure along the support structure of the semiconductor substrate 110 or the spacer 120 may be provided.

A problem with the parasitic capacitance along the support structure between the membrane and the backplate is that it cannot be changed since the dimensions such as the overlap and the distance from the backplate to the membrane are fixed which lead to a SNR defined by the fabrication process of the MEMS structure.

Therefore, a MEMS structure is needed in the art which significantly decreases the parasitic capacitance and which is configured to change the mechanical sensitivity after the fabrication of the MEMS structure is finalized.

An embodiment of the invention provides a segmentation of the backplate electrode and/or the membrane electrode. The backplate electrode and/or the membrane electrode comprising a first electrode configured to provide a sensing signal or to control a system and a second electrode configured to be tuned. In one embodiment of the invention the sensing region and the tuning region are laterally spaced from one another.

An advantage is that the parasitic capacitance of the MEMS structure is significantly reduced because the parasitic capacitance is laterally moved away from the support structure toward the center of the membrane. In a conventional configuration the parasitic capacitance is given by the overlap of the outer region of the membrane and the backplate. The overlap is relatively large because the capacitance is proportional to the circumference times radial overlap. The parasitic capacitance can be calculated by multiplying the overlap area (radial overlap=10 μm-20 μm) with the dielectric constant of the spacer 140 and by dividing the product with the vertical distance of the spacer 140 (vertical distance of spacer=2 μm).

A further advantage is that the same MEMS structure can be tuned, e.g. different mechanical sensitivities and different SNRs can be provided for different applications, with the same MEMS structure.

In general, it is a goal of designing and manufacturing a microphone to achieve the highest signal-to-noise ratio (SNR) possible. Among other things, this can be achieved when the changes in capacitances to be measured is as great as possible and when the parasitic capacitances are as small as possible. The greater this parasitic portion of the capacitance relative to the overall capacitance, the smaller the SNR.

Figure 2A:
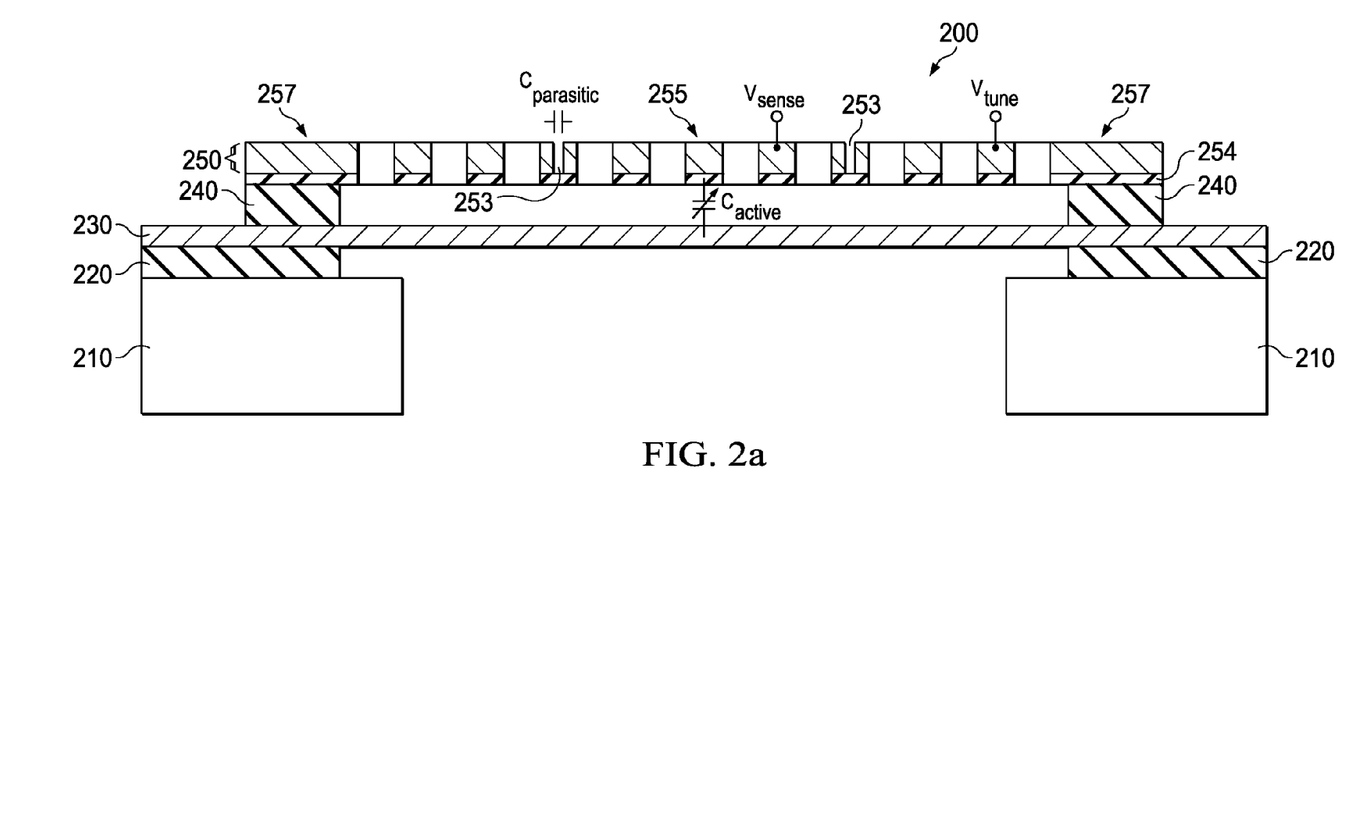
FIG. 2a shows a cross-sectional view of an embodiment of a MEMS structure.
Figure 2B:
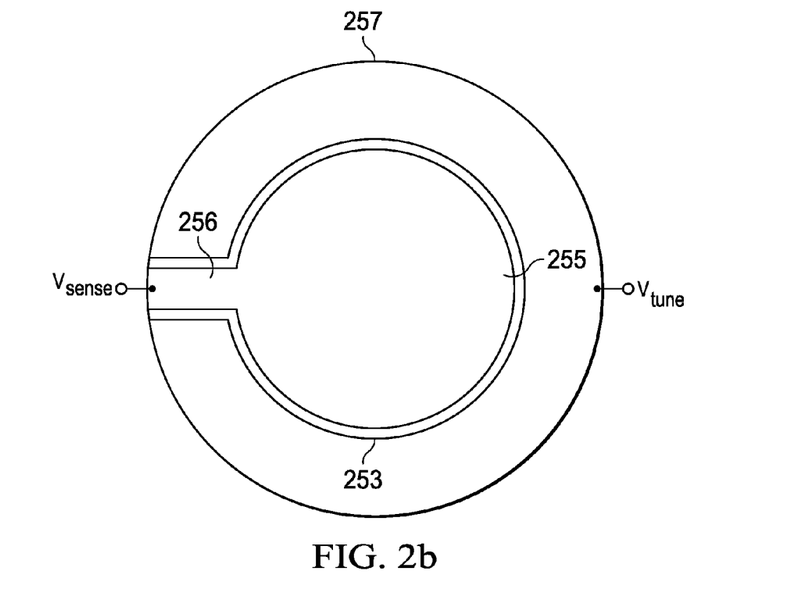
FIG. 2b shows a top view of an embodiment of a backplate.

FIGS. 2a and 2b illustrate a cross-sectional view and a top view of an embodiment of a MEMS structure 200 having a segmented backplate 250. The MEMS structure 200 comprises a semiconductor substrate 210, a membrane 230 and a backplate 250. The membrane 230 is spaced from the substrate 210 by a first spacer 220 and the backplate 250 is spaced from the membrane 230 by a second spacer 240. The materials of the elements of the MEMS structure 200 are the same as described above with respect to FIGS. 1a and 1b.

The segmented backplate comprises a first electrode region 257 and a second electrode region 255. The second electrode region 255 may lie completely or partially within the first electrode region 257 or the first electrode region 257 may completely or partially encompass the second electrode region 255. The first electrode region 257 may be an outer electrode region and the second electrode region 255 may be an inner electrode region. The first electrode region 257 may comprise an area of a circular ring and the second electrode region 255 may comprise an area of a circle. Alternatively, the first electrode region 257 may comprise a plurality of electrodes and the second electrode region 255 may comprise a plurality of electrodes. For example, the first electrode region 257 may comprise a plurality of circular rings.

The first electrode region 257 and the second electrode region 255 may be disposed on an isolation support 254. The isolation support 254 may be disposed over the entire area of the backplate 250 or only over a portion of the backplate 250. The isolation support 254 may be disposed on the side facing the membrane 230 or may be disposed on the side facing away from the membrane 230. The isolation support 254 may comprise silicon dioxide, silicon nitride, a high-k dielectric such as a silicon oxynitride, a poly imide, or a combination thereof. The first electrode region 257 may be isolated from the second electrode region 255 with an isolation gap or isolation groove 253. The isolation groove 253 may be filled with a dielectric material such as silicon dioxide, silicon nitride or a high-k dielectric material such as silicon oxynitride. In an alternative embodiment, the backplate 250 does not comprise an isolation support 254 and the first electrode region 257 is mechanically connected to the second electrode region 255 via the dielectric material of the isolation groove 253.

The second electrode region 255 may be mechanically and electrically connected to the second spacer 240. The second electrode region 255 may comprise a link 256 to the electrical contact in the second spacer 240 forming a notch in the first electrode. The second electrode region 255 may comprise more than one link 256 and the links may be spaced from each other in equal distances.

The second electrode region 255 is configured to provide a sensing signal and the first electrode region 257 is configured to be tuned or actuated. The second electrode region 255 is set to a sensing bias and the first electrode region 257 is set to a tuning bias. The tuning bias of the first electrode region 257 is independent of the sensing bias of the second electrode region 255.

For example, the MEMS structure 200 is tuned by capacitive actuation. The capacitive actuation allows approximately 30% of air gap distance (between the membrane 230 and the backplate 250) variation for voltages below the pull-in voltage. Accordingly, the sensitivity of the MEMS structure can be tuned while the parasitic capacitance does not change. With a change of air gap from 100% to 70% the sensitivity can be increased because the sensitivity is inverse to the air gap distance. For example, the sensitivity can be increased by about +3 dB.

In one embodiment the segmented backplate 250 is a square. The same principles apply for this embodiment than for the segmented circular backplate 250. For example the second electrode region 255 comprises a square and the first electrode region 257 comprises a square ring encompassing the second electrode 255 except for the link or links 256. Alternatively, the backplate 250 comprises other suitable geometrical forms.

Figure 2C:
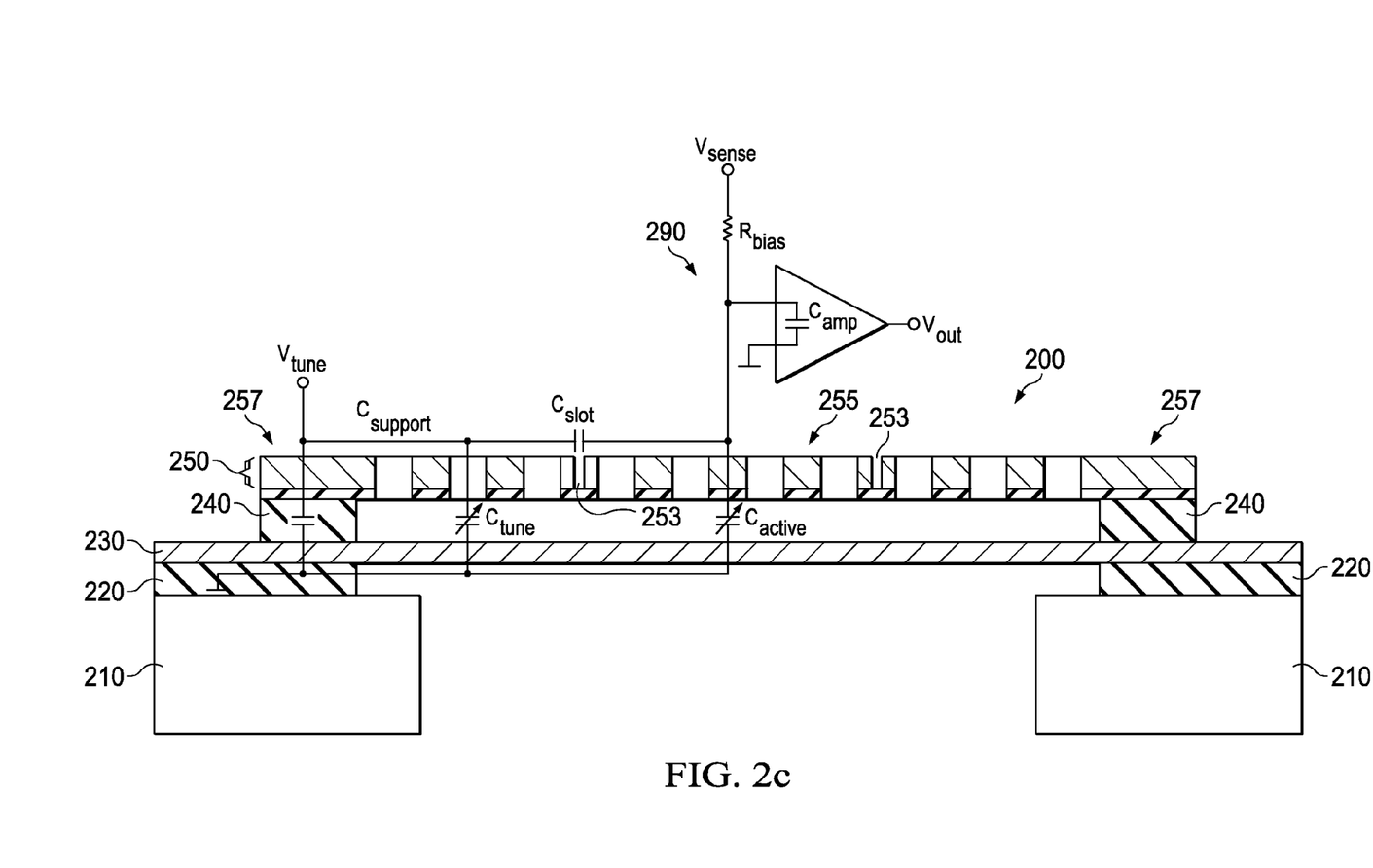
FIG. 2c shows an equivalent capacitive network of the MEMS structure.

In these embodiments the coupling between the backplate 250 and the membrane 230 is reduced and therefore the parasitic capacitance of the MEMS structure 200 is reduced. FIG. 2c shows an equivalent capacitance network of a MEMS structure 200 and a pre-amplifier 290. As can be seen from FIG. 2c the capacitances $C_{support}$, $C_{tune}$, $C_{active}$ and $C_{amp}$ are parallel and therefore add up. Introducing a small capacitance $C_{slot}$ (isolation groove 253) in series between the first electrode region 257 and the second electrode region 255 can reduce the parasitic capacitance of the MEMS structure 200 substantially. In particular, the introduction of the small capacitance $C_{slot}$ increases the sensitivity of the MEMS structure 200 because the sensitivity S is proportional to $C_{active}/(C_{active}+C_{amp}+1/(1/(C_{support}+C_{tune})+1/C_{slot})))$. For $C_{slot}$–>0 the sensitivity S is proportional to $C_{active}/(C_{active}+C_{amp})$.

In one example, the small capacitance $C_{slot}$ is given by the isolation groove 253 (capacitance~area of circumference of 253 times thickness of the layer 257, times dielectric constant of air or dielectric material in the gap of 253). The small series capacitance $C_{slot}$ is smaller by orders of magnitude than the other capacitances, e.g., $C_{support}$ and $C_{tune}$. The smaller parasitic capacitance $C_{slot}$ decouples $C_{support}$ and $C_{tune}$ from $C_{active}$ and $C_{amp}$. Accordingly, the overall parasitic capacitance is decreased and s higher signal to noise ratios is realized.

Furthermore first electrode region 257 can be used for actuating the membrane 230 separately and independently from the second electrode or sensing region 255. By actuation the sensitivity of the MEMS structures 200 can be changed. For example, two MEMS structures can be tuned to tightly match one another (e.g., having about the same sensitivity) or a single MEMS structure can be switched between a high sensitivity configuration and low sensitivity configuration.

Figure 3A:
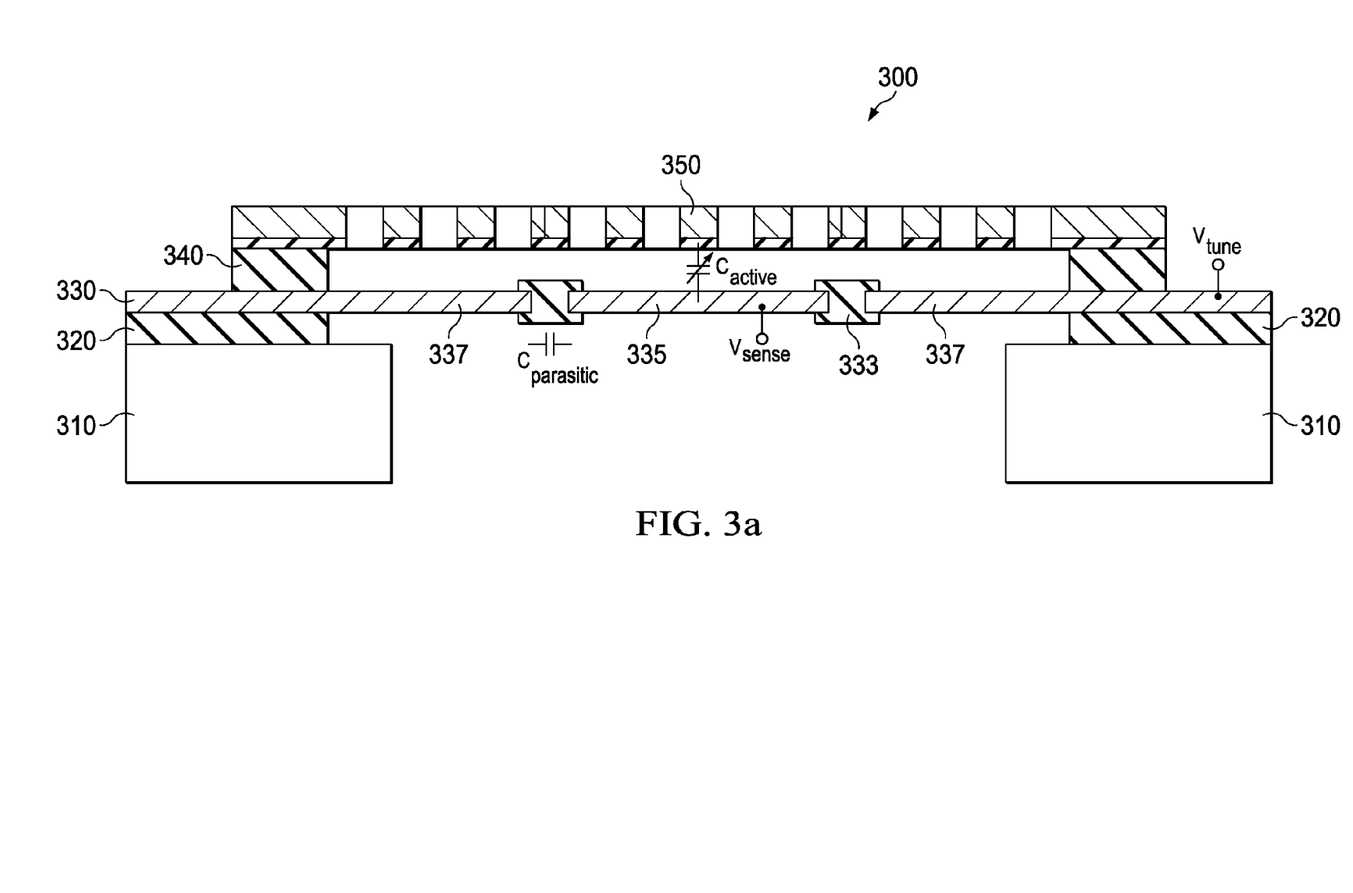
FIG. 3a shows a cross-sectional view of an embodiment of a MEMS structure.
Figure 3B:
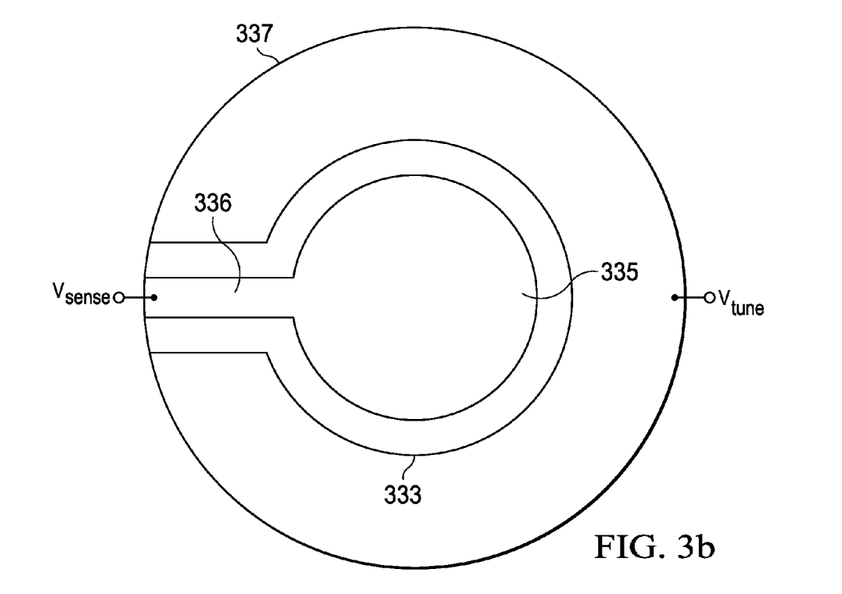
FIG. 3b shows a top view of an embodiment of a movable element.

FIGS. 3a and 3b illustrate a cross-sectional view and a top view of an embodiment of a MEMS structure 300 having a segmented membrane 330. The MEMS structure 300 comprises a substrate 310, a membrane 330 and a backplate 350. The membrane 330 is spaced from the substrate 310 by a first spacer 320 and the backplate 350 is spaced from the membrane 330 by a second spacer 340. The materials of the elements of the MEMS structure 300 are the same as described above with respect to FIGS. 1a and 1b.

The segmented membrane comprises a first electrode 337 and a second electrode 335. The second electrode 335 may lie completely or partially within the first electrode 337 or the first electrode 337 may completely or partially encompass the second electrode 335. The first electrode 337 may comprise an area of a circular ring and the second electrode 335 may comprise an area of a circle. Alternatively, the first electrode 337 may comprise a plurality of electrodes and the second electrode 335 may comprise a plurality of electrodes. For example, the first electrode 337 may comprise a plurality of circular rings. The second electrode 335 is defined as sensing region and the first electrode 337 is defined as tuning or actuation region. The area of the sensing region 335 of the membrane 330 may be larger than the area of the tuning region 337. For example, the sensing region may comprise about 80% of the area of the membrane 330 and the outer region may comprise about 20% of the area.

In an embodiment the first electrode 337 and the second electrode 335 may be disposed on a thin isolation support 334. The isolation support may be disposed on the side facing the backplate 350 or may be disposed on the side facing away from the backplate 350. The thin isolation support may comprise silicon dioxide, silicon nitride, silicon oxynitride, or a combination thereof. For example, the membrane 330 may be a polymer membrane and a metal layer or may be a polysilicon electrode and a silicon nitride layer.

In an embodiment the membrane 330 does not comprise an isolation support. The first electrode 337 is isolated from the second electrode 335 with an isolation region 333. The isolation region 333 may comprise a dielectric material such as silicon dioxide, silicon nitride or a high-k dielectric material such as silicon oxynitride. The first electrode 337 is mechanically connected to the second electrode 335 via the isolation region 333.

The second electrode 335 may be mechanically and electrically connected to the first spacer 340 and the second spacer 320. The second electrode 335 may comprise a link 336 to the first and second spacer 320, 340 forming a notch in the first electrode 337. The second electrode 335 may comprise more than one link 356 and the links may be spaced from each other in equal distances.

The second electrode or the sense region 335 is configured to sense a signal and/or provide a sensing signal and the first electrode or the tuning region 337 is configured to be tuned or actuated. The second electrode 335 is set to a sensing bias and the first electrode 337 is set to a tuning bias. The tuning bias of the first electrode 337 is independent of the sensing bias of the second electrode 335.

The membrane 330 is a circle, square or comprises any other suitable form. The first electrode 337 may comprise a plurality of first electrodes 337, wherein the plurality of first electrodes 337 are configured to be set to the same tuning voltage or to different tuning voltages. The second electrode 335 may comprise a plurality of second electrodes 335, wherein the plurality of second electrodes 335 are configured to be set to the same tuning voltage or to different tuning voltages.

The backplate 350 may comprise a single electrode or a plurality of electrodes. For example the backplate 350 comprises a first electrode and a second electrode. The first electrode of the backplate 350 corresponds to the first electrode 337 of the membrane 330 and the second electrode of the backplate 350 corresponds to the second electrode 335 of the membrane 350. The first electrode of the backplate 350 may be a circular or square ring and the first membrane may be a circular or square ring and the second electrode of the backplate 350 may be a circle or a square and the second membrane may be a circle or square.

Figure 4A:
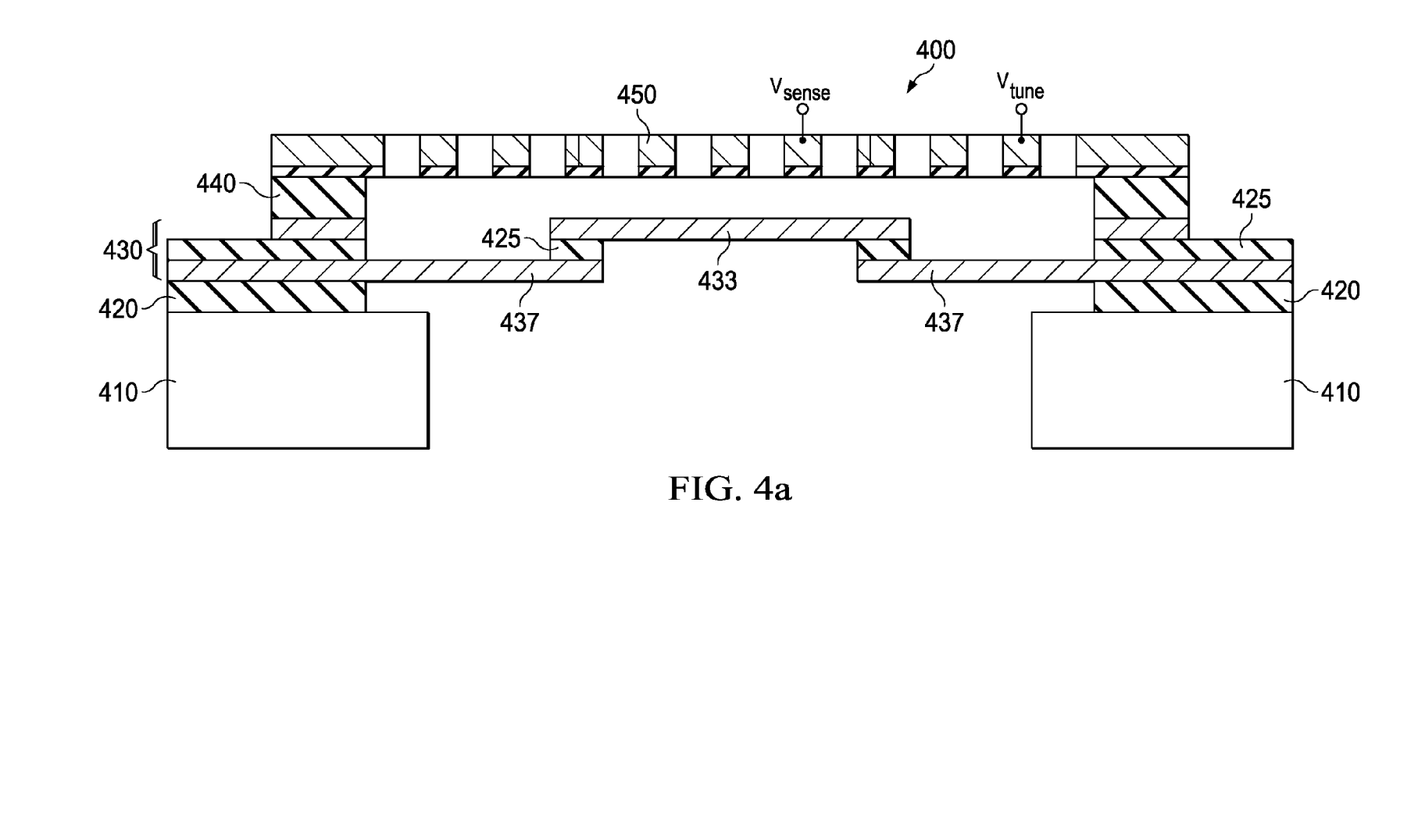
FIG. 4a shows a cross-sectional view of an embodiment of a MEMS structure.
Figure 4B:
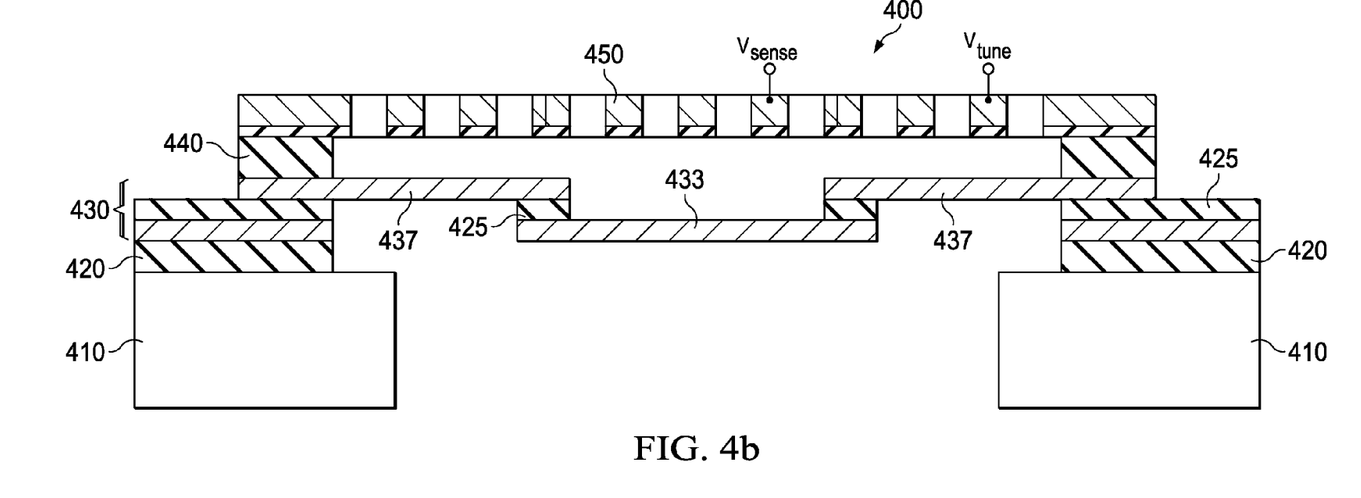
FIG. 4b shows a cross-sectional view of an embodiment of a MEMS structure.

FIGS. 4a and 4b show cross-sectional views of embodiments of a MEMS structure 400. The MEMS structure 400 comprises similar elements 410-450 as described above with respect to FIGS. 3a and 3b. The MEMS structure 400 further comprises an additional membrane 433 and an additional spacer such as third spacer 425. The membrane 433 may comprise a conductive material such as polysilicon, doped polysilicon or a metal. The third spacer 425 may comprise a dielectric or insulating material such silicon dioxide, silicon nitride, a high-k dielectric such as siliconoxynitide or combinations thereof.

The segmented membrane 430 comprises a second electrode or second membrane 437 and a first electrode or first membrane 435. The second membrane 437 may cover an outer region or tuning region of the membrane 430 and the first membrane 435 may cover an inner region or sensing region of the membrane. A portion of the first membrane 435 may overlie a portion of the second membrane 437 or vice versa. A dielectric material of the third spacer 425 mechanically connects these two portions. The dielectric material may substantially form a circular ring or a square ring including lines covering the link.

The first membrane 437 may comprise a single first electrode or a plurality of first electrodes and the second membrane 435 may comprise a single second electrode or a plurality of second electrodes. For example, the first membrane 437 may comprise a plurality of circular rings and the second membrane 435 may comprise a circle. The second membrane 435 is defined as sensing region and the first membrane 437 is defined as tuning region. The area of the sensing region 435 of the membrane 430 may be larger than the area of the tuning region 437. For example, the sensing region 435 may comprise about 80% of the area of the membrane 430 and the tuning region 437 may comprise about 20% of the area.

The first membrane 437 is disposed between the first spacer 420 and the third spacer 425 and the second membrane 433 is disposed between the second spacer 440 and the third spacer 425. In one embodiment, the third spacer material is also disposed between the first membrane 437 and the second membrane 433 in a region distant from the support structure of the spacers 420, 425 and 440. In a first embodiment the second membrane 433 is disposed closer to the backplate 450 than the first membrane 437. In a second embodiment the first membrane 437 is disposed closer to the backplate 450 than the second membrane 433.

The first membrane 437 may be a circular or square ring having a notch and the second membrane 433 may be circle or a square comprising a link lying in the notch. The first membrane 437 may be a ring segment or may be a plurality of ring segments and the second membrane 433 may comprise a plurality of links.

The backplate 450 may comprise a single electrode or a plurality of electrodes. For example the backplate comprises a first electrode and a second electrode. The first electrode of the backplate 450 corresponds to the first membrane 437 and the second electrode of the backplate 450 corresponds to the second membrane 433. The first electrode of the backplate 450 may be a circular or square ring and the first membrane may be a circular or square ring and the second electrode of the backplate 450 may be a circle or a square and the second membrane may be a circle or square.

An advantage of the embodiment of FIG. 4a is that the reduced air gap increases the tuning range of the second membrane 433 (sensing region). An advantage of the embodiment of FIG. 4b that the reduced air gap decreases the tuning range of the second membrane 433 (sensing region).

Figure 5A:
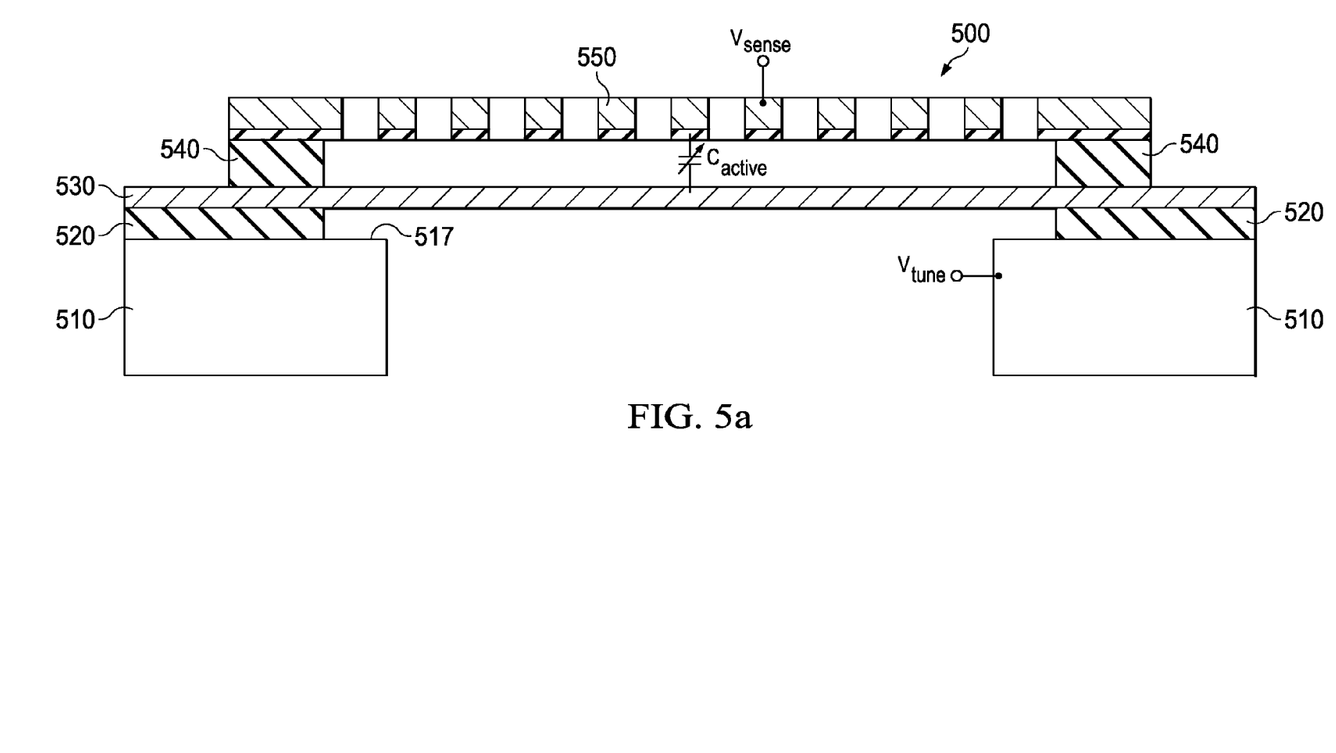
FIG. 5a shows a cross-sectional view of an embodiment of a MEMS structure.
Figure 5B:
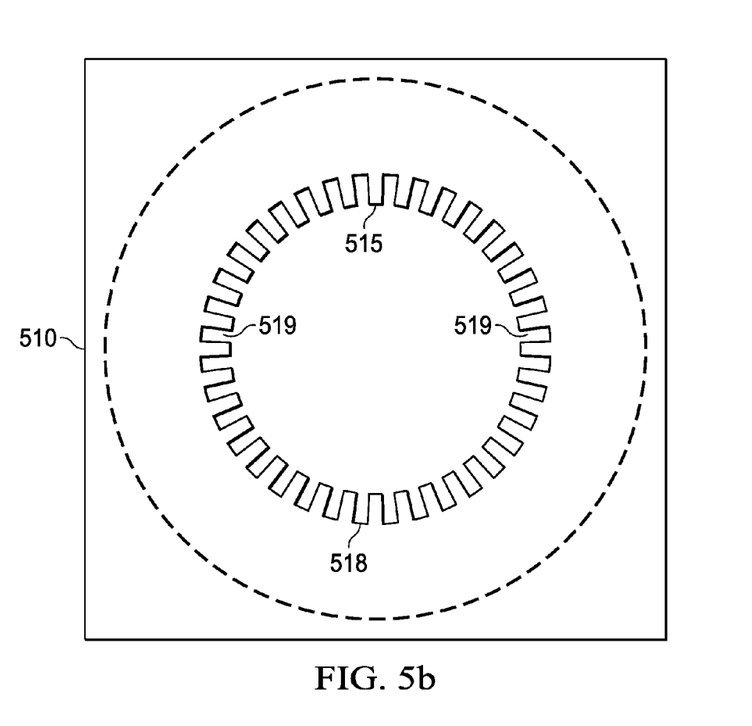
FIG. 5b shows a top view of an embodiment of a rim structure.

FIGS. 5a and 5b show cross-sectional view and a top view of an embodiment of a MEMS structure 500. The MEMS structure 500 comprises similar elements 510-550 as described above with respect to elements 110-150 in FIGS. 1a and 1b. The MEMS structure 500 comprises a single backplate (counter electrode). Alternatively, the MEMS structure 500 comprises a segmented counter backplate (counter electrode) having at least two electrodes.

The semiconductor substrate 510 comprises a rim 515. The radial overlap or radial distance between the rim 515 and the first spacer 520 forms a ring 518. The ring 518 may comprise a circular ring form, a square ring form or other ring form. For example, the radial distance of the circular ring 518 may be 10 μm.

The backplate or counter electrode 550 is configured to be set to a sensing bias ($V_{sense}$) and the semiconductor substrate 510 is configured to be set to a tuning bias ($V_{tune}$). The membrane 530 is set to ground. The membrane 530 comprises a center region and an outer region. The outer region of the membrane 530 and the ring 518 form a capacitor which can be tuned with the tuning voltage ($V_{tune}$). In one embodiment the rim 515 and the ring 518 are serrated. The ring 518 may be perforated with openings 519 being spaced apart in equidistant distances. Each opening 519 may comprise a width of about 10 μm. The openings 519 may be formed in the semiconductor substrate 510 applying an extended release etch.

Figure 6A:
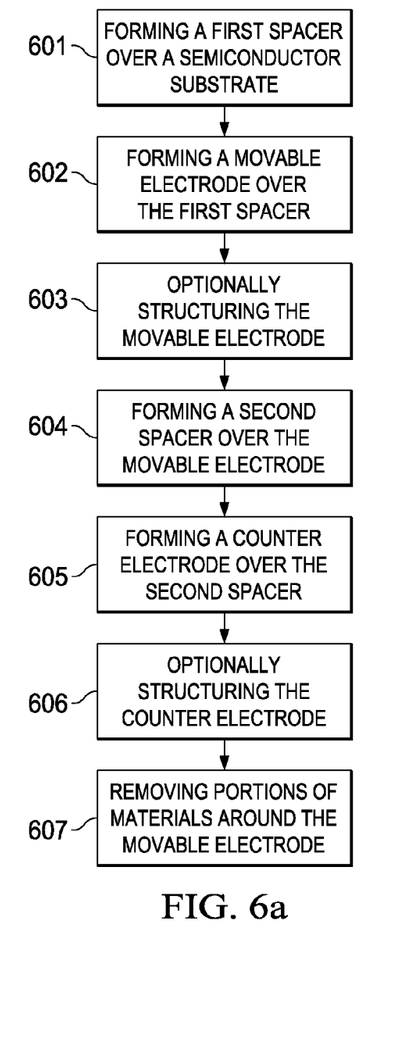
FIGS. 6a-6c show embodiments of a method of manufacturing a MEMS structure.

FIG. 6a shows an embodiment for a method of manufacturing a tunable MEMS device. The method comprises: forming a first spacer over a semiconductor substrate (step 601) and forming a movable electrode over the first spacer (step 602). Optionally, in step 603, the movable electrode is structured in a first movable electrode and a second movable electrode. The movable electrode may be a membrane or a diaphragm. Next, a second spacer is formed over the movable electrode (step 604). Thereafter, a counter electrode is formed over the second spacer (step 605). Again optionally, the counter electrode is structured in a first counter electrode and a second counter electrode (step 606). The counter electrode may be a backplate. Finally in step 607, portions of the first and second spacer materials and the semiconductor substrate material around the movable electrode are removed.

Figure 6B:
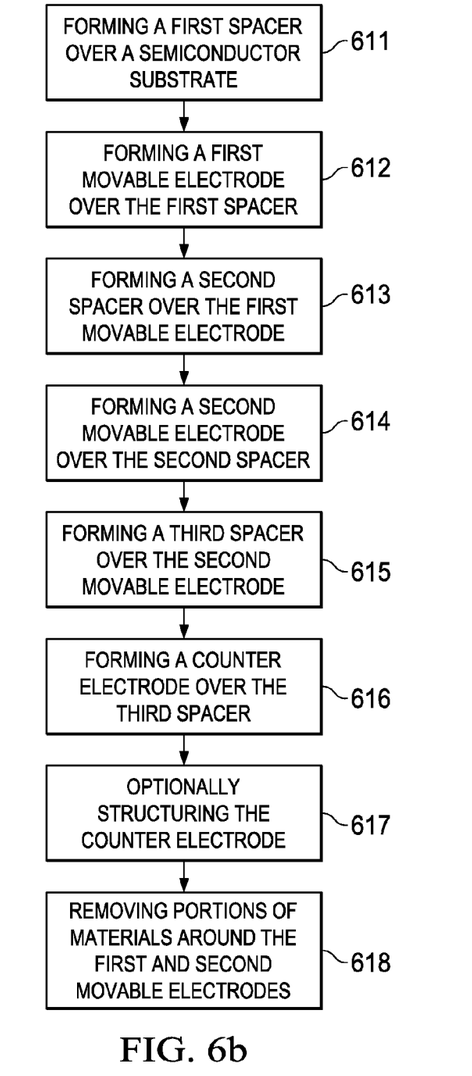

FIG. 6b shows an embodiment for a method of manufacturing a tunable MEMS structure. The method comprises: forming a first spacer over a semiconductor substrate (step 611) and forming a first movable electrode over the first spacer (step 612). Thereafter, a second spacer is formed over the first movable electrode (step 613) and a second movable electrode is formed over the second spacer (step 614). The first and second movable electrode may be membranes or diaphragms. A third spacer is formed over the second movable electrode (step 615) and a counter electrode is formed over the third spacer (step 616). Optionally in step 617 the counter electrode is structured in a first counter electrode and in a second counter electrode. The counter electrode may be a backplate. Finally in step 618 portions of the first, second and third spacer materials, and the semiconductor substrate material around the first and second movable electrodes are removed. The first and second movable electrodes may be mechanically connected in a distance from the support structure.

Figure 6C:
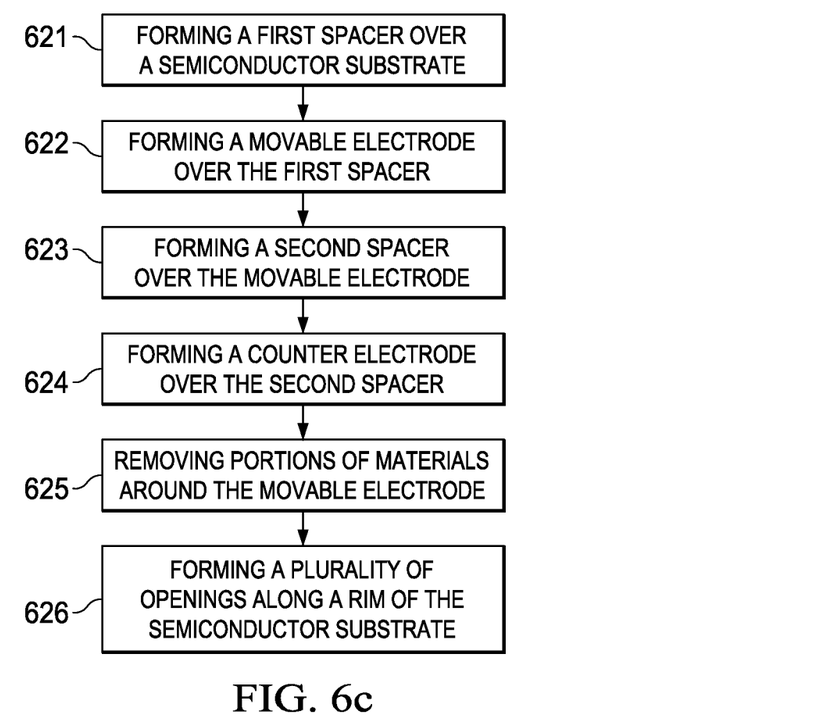

FIG. 6c shows an embodiment for a method of manufacturing a tunable MEMS structure. The method comprises: forming a first spacer over a semiconductor substrate (step 621), forming a movable electrode over the first spacer (step 622) and forming a second spacer over the movable electrode (step 623). The movable electrode may be a membrane or a diaphragm. Next, a counter electrode is formed over the second spacer (step 624). The counter electrode may be a backplate. Next, portions of the first and second spacer materials, and the semiconductor substrate material around the movable electrode are removed (step 625). Finally, a senate structure or a plurality of openings along is etched along a rim of the semiconductor substance (step 626).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a substrate;
a moveable electrode; and
a counter electrode, wherein the moveable electrode or the counter electrode comprises a first region and a second region, wherein the first region is isolated from the second region, wherein the first region is configured to be set to a tuning bias ($V_{tune}$), wherein the second region is configured to be set to a sensing bias ($V_{sense}$), and wherein the moveable electrode and the counter electrode are mechanically connected to the substrate.

2. The semiconductor device according to claim 1, wherein the first region substantially encompasses the second region.

3. The semiconductor device according to claim 1, wherein an area of the second region is substantially larger than an area of the first region.

4. The semiconductor device according to claim 1, wherein the first region or the second region comprises a plurality of electrodes.

5. A MEMS structure comprising:
a substrate;
a moveable electrode comprising a first moveable electrode region and a second moveable electrode region; and
a counter electrode comprising a first counter electrode region and a second counter electrode region, wherein the first counter electrode region is isolated from the second counter electrode region,
wherein the counter electrode and the moveable electrode are mechanically connected to the substrate, wherein the first counter electrode region corresponds to the first moveable electrode region, and wherein the second counter electrode region corresponds to the second moveable electrode region.

6. The MEMS structure according to claim 5, wherein the first moveable electrode region and the first counter electrode region are configured to be set to a tuning bias ($V_{tune}$), and wherein the second moveable electrode region and the second counter electrode region are configured to be set to a sensing bias ($V_{sense}$).

7. The MEMS structure according to claim 5, wherein the first moveable electrode region is disposed closer to the counter electrode than the second moveable electrode region.

8. The MEMS structure according to claim 5, wherein the second moveable electrode region is disposed closer to the counter electrode region than the first moveable electrode.

9. The MEMS structure according to claim 5, wherein the substrate is configured to be set to a tuning bias ($V_{tune}$), and wherein the counter electrode is configured to be set to a sensing bias ($V_{sense}$).

10. The MEMS structure according to claim 5, wherein substrate comprises a serrated rim.

11. A MEMS structure comprising:
a semiconductor substrate;
a backplate electrode; and
a stacked membrane comprising a first membrane and a second membrane,
wherein the stacked membrane and the backplate are mechanically connected to the semiconductor substrate.

12. The MEMS structure according to claim 11, wherein the first membrane is disposed in a center region of the stacked membrane, and wherein the second membrane is disposed in a peripheral region of the stacked membrane.

13. The MEMS structure according to claim 11, wherein an area of the first membrane is larger than an area of the second membrane.

14. The MEMS structure according to claim 11, wherein the first membrane partially overlap the second membrane.

15. The MEMS structure according to claim 11, further comprising a dielectric layer and wherein the dielectric layer mechanically connects the first membrane to the second membrane in a moveable portion of the stacked membrane.

16. The MEMS structure according to claim 11, wherein first membrane is configured to provide a sensing signal and wherein the second membrane is configured to be tuned.

17. The MEMS structure according to claim 11, wherein the first membrane is closer to the backplate electrode than the second membrane.

18. The MEMS structure according to claim 11, wherein the second membrane is a closer to the backplate than the first membrane.

19. A semiconductor device comprising:
a substrate;
a moveable electrode; and
a counter electrode comprising:
an isolation support;
a first conductive region disposed on the isolation support;
a second conductive region disposed on the isolation support; and
an isolation groove isolating the first conductive region from the second conductive region,
wherein the moveable electrode and the counter electrode are mechanically connected to the substrate.

20. The semiconductor device according to claim 19, wherein the first conductive region substantially encompasses the second conductive region.

21. The semiconductor device according to claim 19, wherein the second conductive region comprises about 80% of an area of the counter electrode, and wherein the first conductive region comprises about 20% of the area of the counter electrode.

22. The semiconductor device according to claim 19, wherein the isolation support is disposed between the moveable electrode and the counter electrode.

23. A semiconductor device comprising:
a substrate;
a moveable electrode comprising a first moveable electrode region, a second moveable electrode region, and an isolation region disposed between the first moveable electrode region and the second moveable electrode region; and
a counter electrode, wherein the counter electrode and the moveable electrode are mechanically connected to the substrate.

24. The semiconductor device according to claim 23, wherein the isolation region is disposed between the first moveable electrode region and the second moveable electrode region in a plane of the moveable electrode.

25. The semiconductor device according to claim 23, wherein the first moveable electrode region substantially encompasses the second moveable electrode region.

26. The semiconductor device according to claim 23, wherein the second moveable electrode region comprises about 80% of an area of the moveable electrode, and wherein the first moveable electrode region comprises about 20% of the area of the moveable electrode.

27. The semiconductor device according to claim 23, wherein the isolation region is disposed on the first moveable electrode region, and wherein the second moveable electrode region is disposed on the isolation region.

28. The semiconductor device according to claim 23, wherein the isolation region is disposed on the second moveable electrode region, and wherein the first moveable electrode region is disposed on the isolation region.

29. A MEMS structure comprising:
a substrate, wherein substrate comprises a serrated rim;
a moveable electrode; and
a counter electrode comprising a first counter electrode region and a second counter electrode region, wherein the first counter electrode region is isolated from the second counter electrode region, and wherein the counter electrode and the moveable electrode are mechanically connected to the substrate.

30. A MEMS structure comprising:
a substrate;
a moveable electrode; and
a counter electrode comprising a first counter electrode region and a second counter electrode region, wherein the first counter electrode region is isolated from the second counter electrode region, wherein the counter electrode and the moveable electrode are mechanically connected to the substrate, wherein the substrate is configured to be set to a tuning bias ($V_{tune}$), and wherein the counter electrode is configured to be set to a sensing bias ($V_{sense}$).

* * * * *